United States Patent [19]
Robbins et al.

[11] Patent Number: 5,566,188
[45] Date of Patent: Oct. 15, 1996

[54] LOW COST TIMING GENERATOR FOR AUTOMATIC TEST EQUIPMENT OPERATING AT HIGH DATA RATES

[75] Inventors: Bradford B. Robbins, Wellesley, Mass.; Benjamin J. Brown, Westlake Village; Peter A. Reichert, Thousand Oaks, both of Calif.

[73] Assignee: Teradyne, Inc., Boston, Mass.

[21] Appl. No.: 413,063

[22] Filed: Mar. 29, 1995

[51] Int. Cl.$^6$ ................................................. G01R 31/28
[52] U.S. Cl. ........................................ 371/27; 395/550
[58] Field of Search ................................. 371/27, 28, 61, 371/62; 395/550, 183.06; 324/158 R, 158.1

[56] References Cited

U.S. PATENT DOCUMENTS

| | | | |
|---|---|---|---|
| 4,079,456 | 3/1978 | Lunsford et al. | 364/200 |
| 4,482,983 | 11/1984 | Slechta, Jr. | 364/900 |
| 4,564,953 | 1/1986 | Werking | 377/52 |
| 4,779,221 | 10/1988 | Magliocco et al. | 364/900 |
| 4,789,835 | 12/1988 | Herlein | 328/72 |
| 4,806,852 | 2/1989 | Swan et al. | 324/73 R |
| 5,122,988 | 6/1992 | Graeve | 365/219 |
| 5,274,796 | 12/1993 | Conner | 395/550 |
| 5,280,486 | 1/1994 | Arkin et al. | 371/29.1 |
| 5,321,700 | 6/1994 | Brown et al. | 371/27 |
| 5,321,702 | 6/1994 | Brown et al. | 371/27 |
| 5,437,021 | 7/1995 | David et al. | 395/550 |
| 5,477,139 | 12/1995 | West et al. | 324/158 |

*Primary Examiner*—Vincent P. Canney
*Attorney, Agent, or Firm*—Edmund J. Walsh

[57] ABSTRACT

Automatic test equipment with a programmable timing generator. In the timing generator, the required delay is split into a course delay, a frequency adjustment delay, and a fine delay. The fine delays for successive cycles are temporarily stored. As the course delays pass, the fine delays are retrieved and used to generate edge signals. The frequency adjustment delay is used to offset the time at which the fine delay is retrieved by a fraction of a the resolution of the course delay. This arrangement allows the fine delay values to be retrieved at a higher rate than the rate at which the signals representing the required delays were generated. With this arrangement, the edges can be generated in a high frequency burst mode even though much of the timing generator is implemented with circuitry that has a lower operating frequency. A significant cost savings results by providing high frequency operation with less expensive components of lower operating frequency.

24 Claims, 5 Drawing Sheets

LOW COST TIMING GENERATOR FOR AUTOMATIC TEST EQUIPMENT OPERATING AT HIGH DATA RATES

This invention relates generally to automatic test equipment and more specifically to automatic test equipment in which timing signals occur at programmed times.

Automatic test equipment (called generally a "tester") is used to test many electronic items and components such as printed circuit boards and VLSI devices. Testers execute a test pattern which is made up of test vectors. Each vector contains information about the test signals that should be applied to the device under test ("DUT") or should be received from a properly functioning DUT during one cycle of the tester's operation.

Each signal applied to or received from the DUT is processed in a separate "channel" of the tester. For a VLSI component tester, there is one channel for each pin of the VLSI component.

To test complicated electronic components, it is necessary for a user to be able to precisely specify the signals that are applied to or expected from the DUT. One of the parameters which must be specified is the time when a signal should occur. Two pieces of information are usually provided to specify the time of a signal. First, the length of one cycle, or period, of the tester is specified. The period is generally the same for all channels. Second, the length of time after the start of the cycle is specified for the signal. This time, or delay, may be different in each channel.

To make the tester drive or check for a signal at the desired time, commercially available testers contain timing generators. The timing generator produces timing signals, sometimes called "edges." The input and output operations of the tester are synchronized to these edges. For example, one edge causes an output driver to start driving its output while another edge causes the output driver to stop driving the output. One edge signal causes a comparator to start comparing an input signal to an expected value while another edge signal causes the comparator to stop the comparison The time when each edge occurs relative to the start of a cycle can be programmed by a user. This time is sometimes called a "programmed delay." In some commercially available testers, such as the J971 sold by Teradyne, Inc., Aguora Hills, Calif., U.S.A., a very high level of control over the timing of events is possible. The user may program the length of one period. The period may be changed during a test, but is the same for all channels. Also, the user may specify the programmed delay for each edge. The programmed delay for edges in each channel may be specified separately and may be changed during any cycle of the tester. One example of a timing generator which provides this level of control may be found in U.S. Pat. No. 5,274,796, which is hereby incorporated by reference.

FIG. 1 shows the timing generator of such a tester. The timing generator contains two parts: global timing generator 110 and local timing generators 101. There is typically at least one local timing generator for each channel of the tester. However, it is possible to use the same timing generator for multiple channels.

Global timing generator 110 generates a BOC signal, which stands for beginning of cycle. The BOC signal goes high once for each cycle the tester will execute. The BOC signal is routed to each channel.

The BOC signal may be thought of as a course indication of when a tester cycle starts. Ideally, the period can be specified to a very high resolution, such as 10 ps. Global timing generator 110 does not produce a BOC signal with 10 psec resolution. Rather, the BOC signal will have a resolution of some much higher value, such as 10 nsec. To compensate for this low resolution, global timing generator 110 also produces a signal which indicates the time difference between the BOC pulse and the time which should be the start of a tester cycle based on the programmed period. This signal is referred to as a residue signal. It is a digital signal with a sufficient number of bits to specify the start of the tester cycle with the required resolution.

Global timing generator 110 also sends programmed delay information to each channel. The local timing generator produces a pulse which is delayed by the programmed amount after the start of a tester cycle. The programmed delay information may be the amount of the delay in digital form or may be the address in a memory in which the amount of delay is stored in digital form.

The local timing generator combines the residue value and the programmed delay as one step in computing how long after the BOC pulse an edge should be generated. In addition, the local timing generators compute a delay which is unique to each edge in each channel. This delay compensates for the different propagation length of each channel. This value is sometimes called a "deskew value." The deskew value is also in digital form.

The residue value, the programmed delay and the deskew value are combined in digital form to produce a signal which indicates the amount of time the edge signal should be generated after the BOC signal. Some of this delay may be accomplished with digital delay circuitry. Greater resolution is achieved than in the global timing generator by using a higher frequency clock in the local timing generator. The digital delay might also be provided in one or more steps, each step providing a portion of the delay. However, the digital delay is still a course delay and does not provide the required resolution.

A final fine delay is then added to the edge signal to provide the required resolution. This delay is usually provided by an interpolator. An interpolator is implemented from an analog comparator. One input of the comparator is fed with an analog ramp signal. The other input is fed by a digital to analog converter (DAC). The digital value representing the required fine delay is input to the DAC and establishes a trigger value for the comparator. The length of time it takes for the ramp signal to reach the trigger value will be proportional to the magnitude of the delay value input into the DAC. In this way, an edge signal can be produced at a precisely defined time after the start of the ramp signal.

FIG. 1 shows global timing generator 110 connected to numerous channels $101_1$, $101_2$ . . . $101_N$. Each channel contains timing logic 112. There is one copy of timing logic 112 for each edge signal. There are multiple copies of timing logic 112 in each channel because each channel generates more than one edge signal. Timing logic 112 computes the digital delay required to be introduced into the edge. It may also provide a course digital delay.

Each channel also includes an interpolator circuitry 114. There are multiple copies of interpolator circuitry 114 for each channel as there is also one interpolator for each edge signal. Interpolator circuitry 114 provides the final delay. The final delay is provided by a course digital delay and a fine delay from an analog interpolator.

The edges from all of the interpolator circuits in one channel are provided to format circuit 116. Format circuit 116 contains the drivers and comparators needed to perform the required I/O operations. In addition to receiving edge signals, format circuit 116 receives format information and data values. The information about which format is in use is passed from timing logic 112. The format information is programmed by the user. It is provided first to timing logic 112 because the amount of deskew needed for an edge signal sometimes depends on the format being used.

Global timing circuitry 110 and timing logic 112 are implemented with CMOS components. CMOS is relatively inexpensive. Cost is an important factor in implementing the timing generation circuitry because of the large amount of timing ciruitry in a tester. FIG. 1 shows that there are multiple copies of timing logic 112. Typically, there are six edge signals per each channel and there could be hundreds of channels. Each tester therefore could includes thousands of copies of timing logic 112.

The drawback of CMOS is that it has a limited operating speed. Standard CMOS components can operate at clock frequencies up to about 100 MHz. At that clock frequency, the best resolution which can be achieved with a digital delay is only 10 nsec (i.e. the period of the clock signal).

To provide the required time resolution, interpolator circuitry 114 is implemented with a technology that operates at a higher clock frequency. Traditionally bipolar technology has been used. With this technology, time resolutions of 16 psec have been achieved in commercially available testers.

Even with such an approach, there are undesirable limits on the way that edges may be programmed. The CMOS circuitry can generate commands to the interpolator circuitry no faster than one every 10 nsec. When a user programs edges, sometimes the same edge is to occur late in one cycle but early in the following cycle. The time difference between successive occurrences of the edge becomes less than one test cycle. If the time difference becomes less than 10 nsec, the CMOS circuitry can not provide the control information to interpolator circuitry 114 fast enough for it to generate the appropriate edges.

In addition, we have recognized that fast interpolator circuitry 114 can be made to generate edges at a faster rate than the approximately 100 MHz at which CMOS components can operate. It would be highly desirable to generate edges at a rate of greater than 100 MHz even though timing logic circuitry is implemented with low cost CMOS components.

High speed architectures are also used to make testers run fast. For example, pipelining is a widely used technique. In pipelining, large circuits are broken into stages, with the inputs and outputs of consecutive stages separated by registers. During each cycle, each stage operates on the data in the registers at its input and then places results in the registers at its output. The data path between the input and the output of each stage is shorter than the data path between the input and the output of the entire circuit. As a result, there are smaller delays in each stage. Data can be clocked through the pipelined circuit at a rate equal to the rate at which data can be clocked through the slowest stage, which is faster than data could be clocked through the entire circuit. However, the rate at which data can be clocked through each stage is still limited by the operating speed of the devices used to make that stage. Where CMOS parts are used, the limitation is still about 100 MHz.

A second high speed architecture uses parallel data paths in conjunction with pipelining. For example, to run at 200 MHz, the tester can be divided into two parallel paths which each run at 100 MHz. The data from the two paths are interleaved at the end to provide a signal at a data rate twice that of either path individually.

There is today a demand for testers which operate at speeds of 200 MHz oral, higher. The same problems occur in a 200 MHz tester broken into two 100 MHz channels. Neither channel operates, when implemented in CMOS, fast enough to allow edges to be programmed as required.

A further problem with current timing generators is the implementation of the analog interpolator. The analog ramp and the output of the DAC provided to the comparator must have precisely matching values. For example, if the analog interpolator is to provide a programmed delay of between 0 and 5 nsec, the ramp must change in voltage by an amount equal to the full scale output value of the DAC in exactly 5 nsec. There are two ways these values have been matched. One way is to adjust the analog voltage which is the full scale reference value for the DAC. A second way is to use to control the slope of the analog ramp. Either of these adjustments might be made, for example, using a second DAC. Both of these solutions involve changes in the analog circuitry of the tester and are therefore relatively expensive and difficult to implement. It would be desirable to have an analog interpolator which could be more easily calibrated.

SUMMARY OF THE INVENTION

With the foregoing background in mind, it is an object of the invention to provide a tester implemented with low cost, slow speed components which allows edges to be programmed.

It is also an object to provide a tester with edges which can be programmed with greater resolution than the data output rate of some components in the timing generator.

It is also an object to provide a tester operating at 100 MHz using CMOS timing generation circuitry while still allowing edges to be programmed.

It is a further object to provide a tester operating at 200 MHz using CMOS timing generation circuitry while still allowing edges to be programmed.

It is yet another object to provide an analog interpolator which can be easily calibrated.

The foregoing and other objects are achieved in the timing generator of a tester which includes a control circuitry operating at a slow speed and with low timing resolution and faster circuitry making a high precision final timing adjustment. The slow circuitry and fast circuitry are separated by a FIFO.

According to one feature of the invention, the read control signals from the FIFO are generated by the slow speed circuitry, but are adjusted by the faster circuitry to allow data to be read from the FIFO at a rate which is faster than the rate at which the slow speed circuitry operates.

In one embodiment, the slow speed circuitry includes a plurality of counters, each of which generates a read control signal for the FIFO Which is adjusted by the faster circuitry based on other control signals generated by the slow circuitry.

In one embodiment, the timing logic is implemented using CMOS technology, which is lower cost, while the timing interpolator is implemented using BJT technology, which operates at a higher speed for higher cost.

In yet another embodiment, the timing generator includes a multiplier which adjusts the digital input to the interpolator based on the full scale output of a DAC in the analog interpolator.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
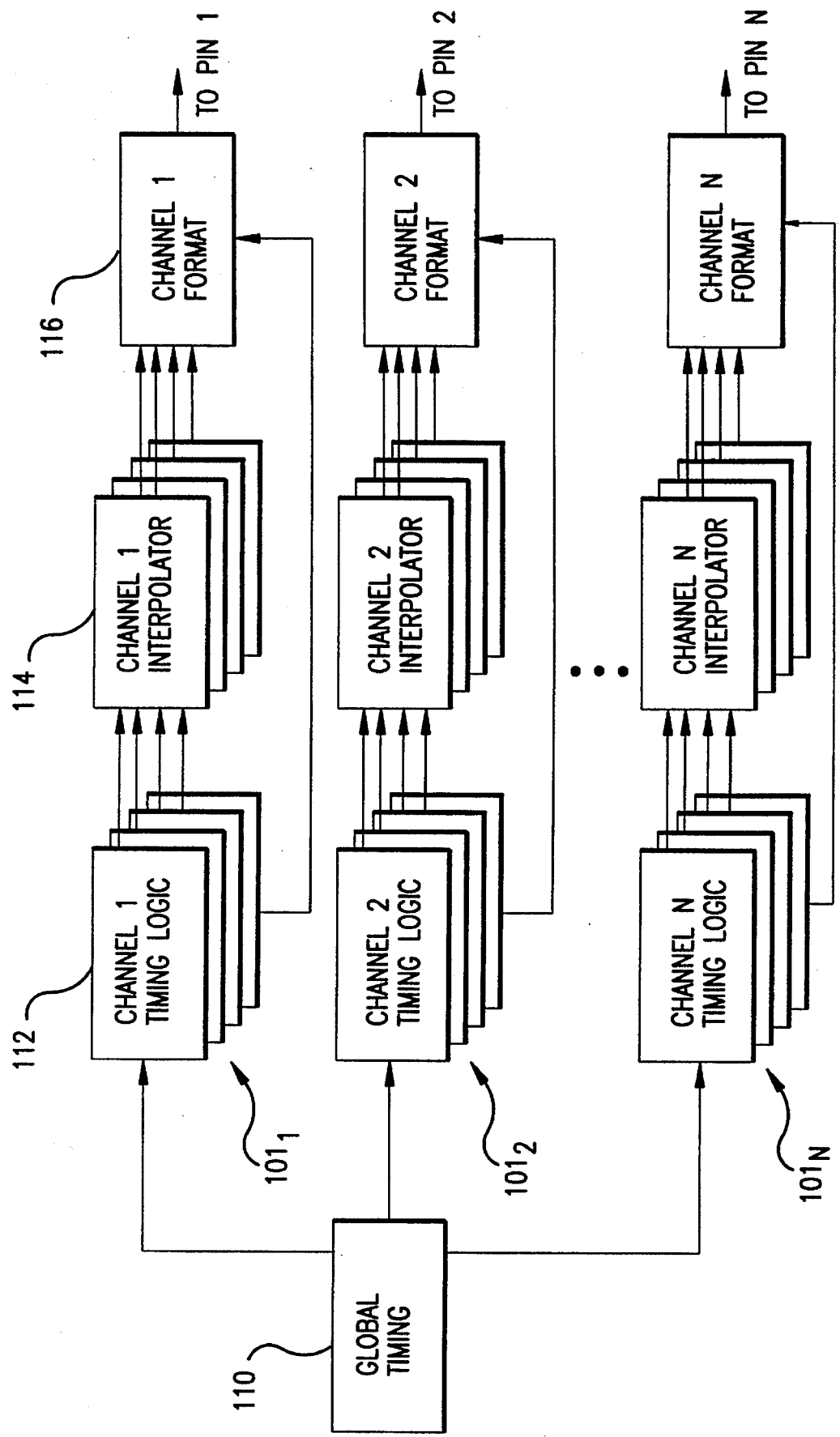
FIG. 1 is a block diagram of the timing generator of a prior art tester.
Figure 3:
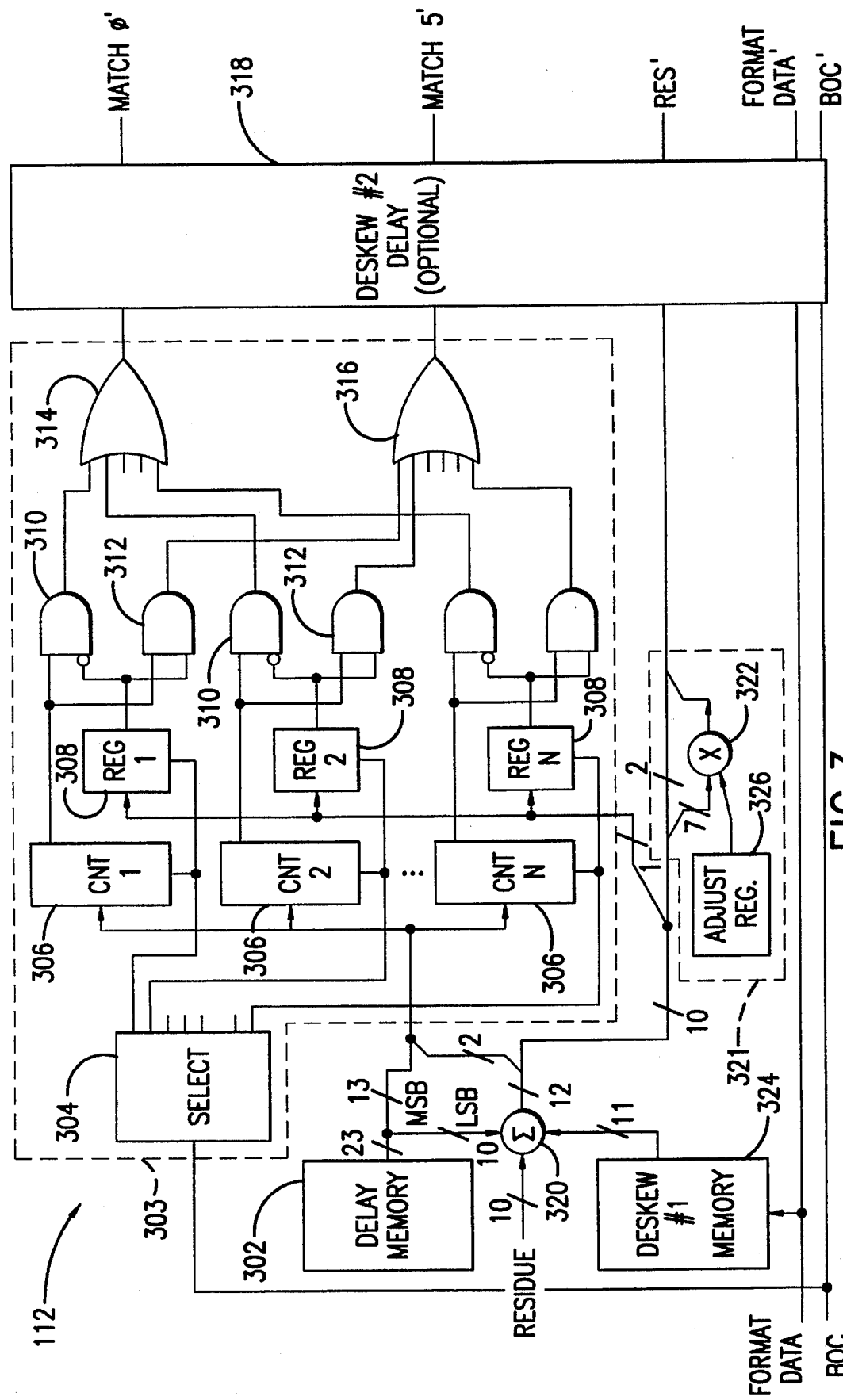
FIG. 3 is a block diagram of timing logic circuitry incorporating the invention.
Figure 4:
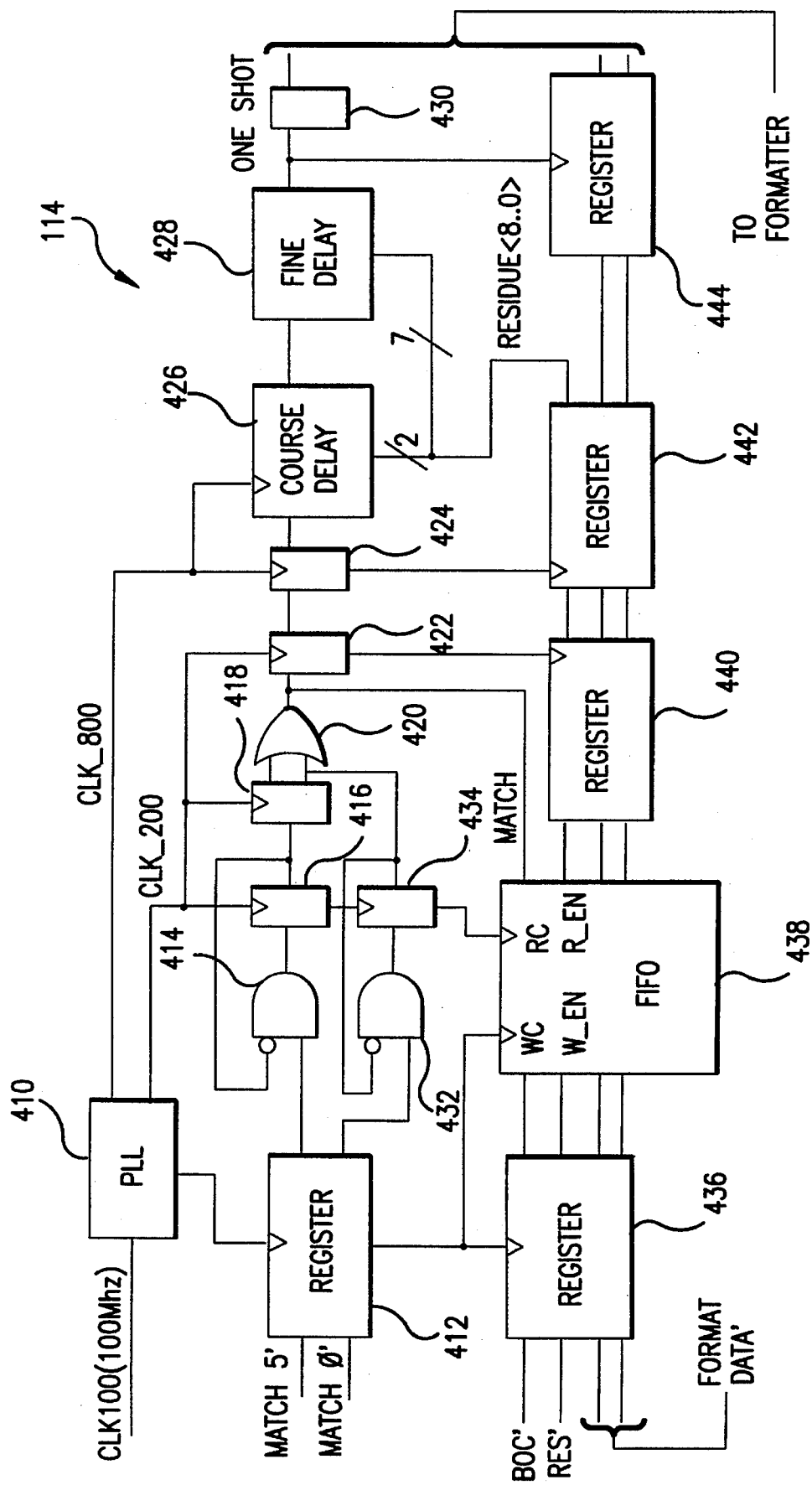
FIG. 4 is a block diagram of interpolator circuitry incorporating the invention.
Figure 5:
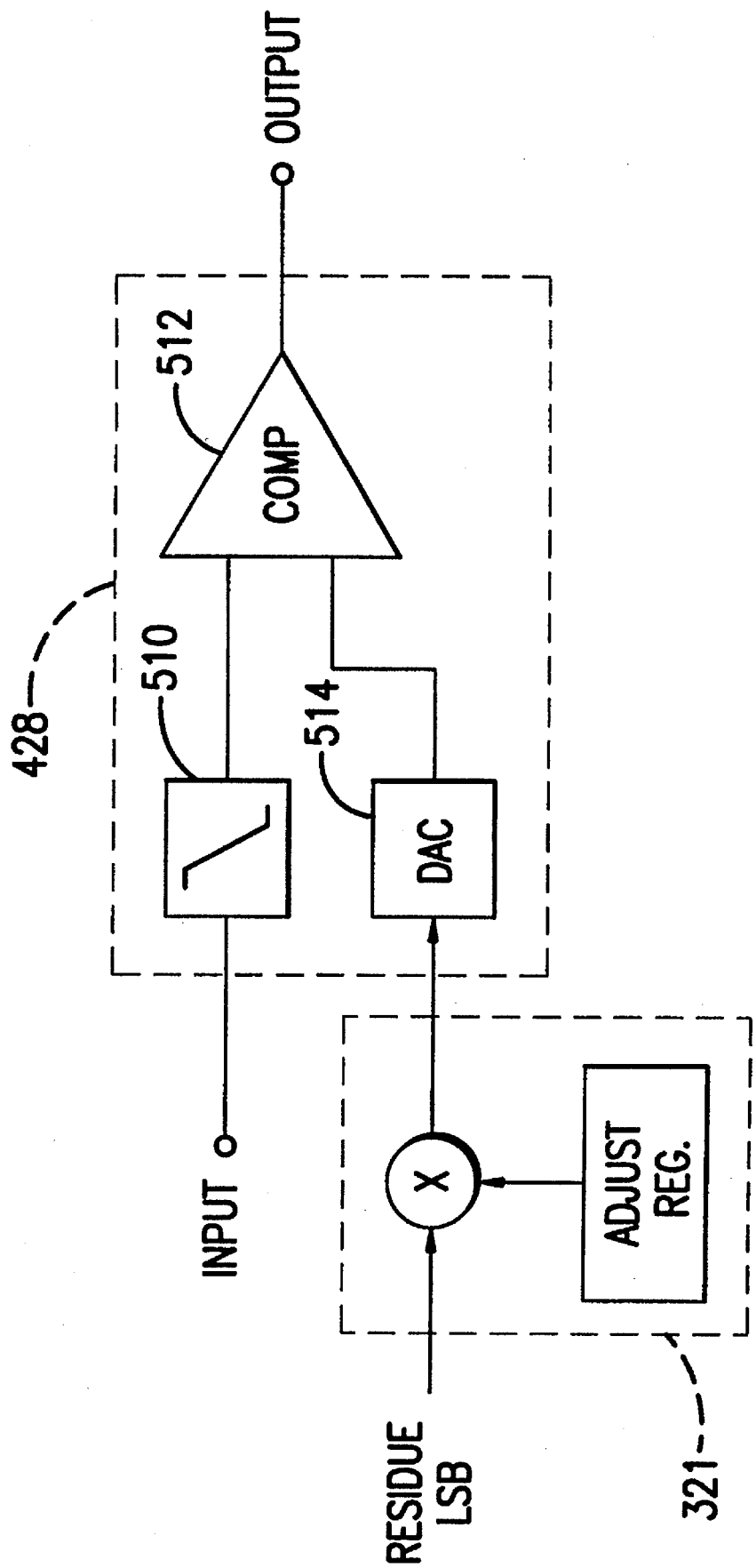
FIG. 5 is a block diagram of an analog interpolator according to the invention.

The invention is achieved with a timing generator as shown generally in FIG. 1. Improved elements according to the invention are shown in FIGS. 3, 4 and 5.

Figure 2:
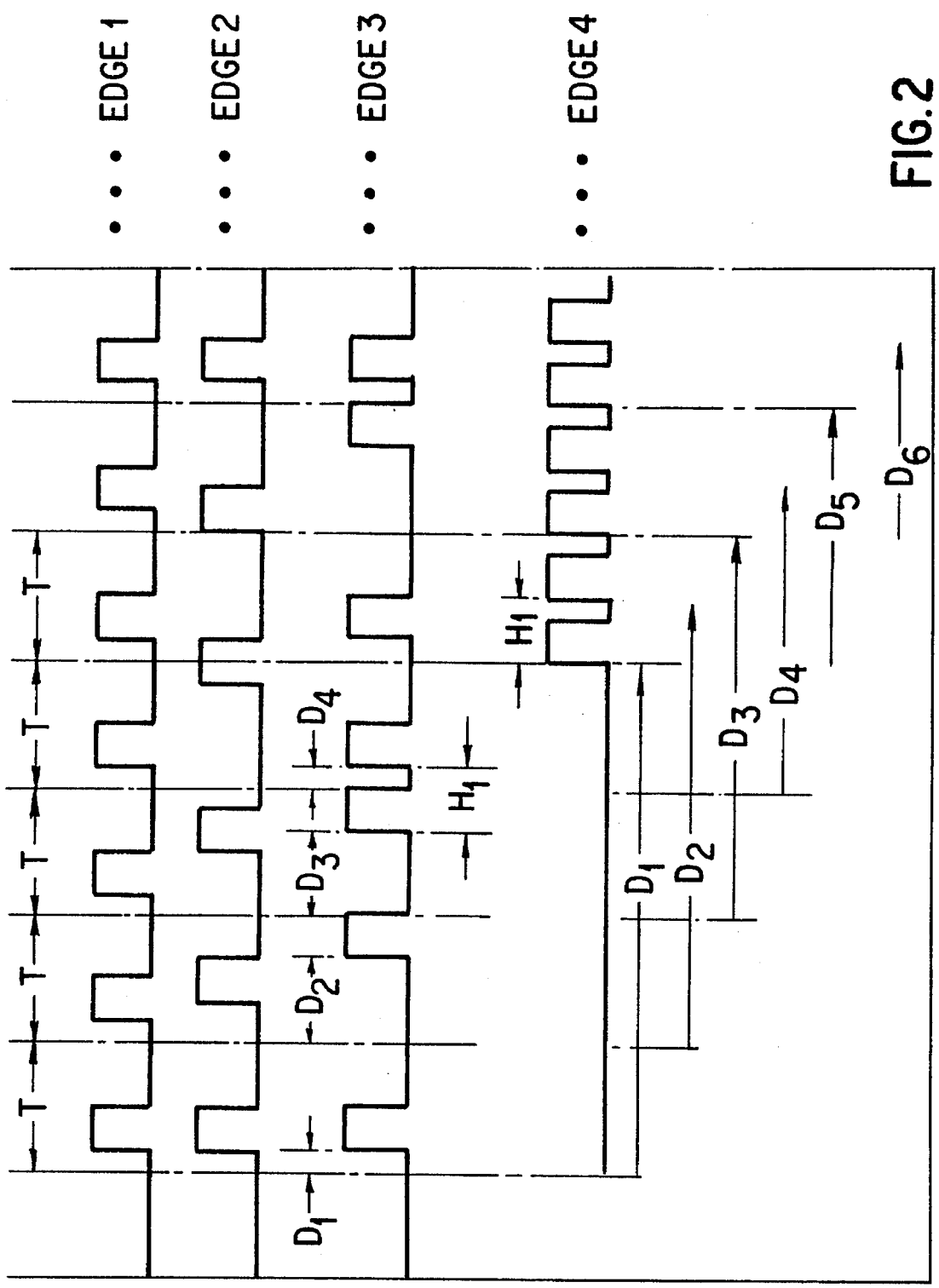
FIG. 2 is a timing diagram useful in understanding the invention.

FIG. 2 shows a timing diagram of signals which might be generated by a testes using such a timing generator. The timing diagram is divided into cycles of tester operation. Each cycle is shown to have a period, T. The time T can be programmed by the user and may even be changed during operation of the tester as in the prior art. However, in FIG. 2, the cycles are shown with a constant length for simplicity.

FIG. 2 shows several edge signals generated by the timing generator. EDGE 1 is generated a fixed delay after the start of each tester cycle. EDGE 2 is an example of an edge which is delayed a variable amount after the start of each cycle. However, the programmed delays are such that consecutive pulses of EDGE 2 are spaced apart by at least one tester cycle. Both the EDGE 1 and EDGE 2 signals can be generated with prior art timing generators and are shown here for comparison.

EDGE 3 shows a signal which also has a variable programmed delay. In contrast to EDGE 2, some pulses in EDGE 3 are spaced apart by an amount Hi which is less than a tester cycle. Prior art testers using CMOS technology could generate such signals, but only if $H_1$ was greater than about 10 nsec. Ten nsec is the minimum achievable spacing between signals which could be generated by timing logic 112 (FIG. 1) operating at 100 MHz. As will be described below, the minimum achievable spacing between edge signals in a timing generator according to the invention will be dictated by the timing of interpolator circuitry 114. As interpolator circuitry 114 operates at a higher frequency, the minimum achievable time for Hi will be smaller. As described herein, interpolator circuitry 114 uses a 200 MHz clock. In a preferred embodiment, the minimum achievable time for $H_1$ is 5 nsec.

EDGE 4 shows an edge signal in which adjacent pulses are delayed to produce a burst of more than two pulses at intervals which are much closer together than one period. In EDGE 4, the pulses are delayed by greater than a cycle of the tester. The amount of the delays $D_1, D_2, \ldots D_6$ successively decrease so that the generated pulses are spaced close together. The pulses are shown spaced apart by $H_1$. As for EDGE 3, the minimum achievable time for $H_1$ is dictated by the clock frequency used in interpolator circuitry 114.

Turning now to FIG. 3, timing logic 112 (FIG. 1) according to the invention is shown. FIG. 3 shows the circuitry needed to generate one edge in one channel. Multiple versions of the circuitry are included in a tester.

In a preferred embodiment, timing logic 112 is implemented as a CMOS gate array. Multiple copies of the circuit may be included in the gate array. The CMOS gate array is clocked at 100 MHz. For clarity, timing signals are not expressly shown. Likewise, power connections and other signals conventionally included in digital circuitry are not expressly shown.

Timing logic 112 receives a BOC signal and RESIDUE signal from global timing generator 110. The programmed delay is stored in memory 302 and is retrieved in response to address information from other portions of the tester (not shown). A deskew delay which is format dependent is included in deskew memory 324. A digital value representing a portion of the deskew value is retrieved from deskew memory 324.

The 10 least significant bits of the programmed delay, the RESIDUE and the value from deskew memory 324 are added in adder 320. In a preferred embodiment, the least significant bit of the output of adder 320 represents a time delay of 10 psec. That value represents the edge placement accuracy of the timing generator.

The two most significant bits of the output of adder 320 are combined with the 13 most significant bits out of delay memory 302. The resulting 15 bit digital quantity is provided to digital delay circuitry 303. The least significant bit of the input to digital delay 303 represents a delay of 10 nsec. That delay value is not important to the invention, but preferably matches the period of the clock applied to digital delay circuit 303.

Digital delay circuit 303 produces a match signal after the time specified by the digital input to digital delay 303 has passed. As will be described below, one of two possible match signals is produced for each digital input. Those two signals are MCH0 and MCH5. It should be appreciated that though only one of the signals MCH0 and MCH5 is asserted for each digital input, Successive digital inputs could have values such that in any one period both MCH0 and MCH5 are asserted.

Digital delay circuit 303 could be implemented with a bank of counters 306. Each counter can accept the entire 15 bit input to digital delay 303. Which counter is loaded with the input is determined by select circuit 304. Counters 306 are loaded with delay information for successive pulses in "round robin" fashion.

Select circuit 304 is a state machine which generates a signals on successive output lines in response to the BOC signal. One example of a circuit which performs such a function is a ring counter.

FIG. 3 shows some number, N, of counters. The actual number is not important to the invention, but 6 are used in the preferred embodiment. Six counters 306 allows delays programmed for six tester cycles to be tracked simultaneously. In the preferred embodiment, pulses specified within the earlier cycles must be programmed to occur before any pulse in a later cycle. This requirement simplifies the hardware needed to implement the invention.

Each counter 306 has a one bit register 308 associated with it. One of the registers 308 is loaded with the next most significant bit of the output of adder 320 remaining after the two most significant bits were input to a counter 306. This bit represents a time interval equal to one half of the smallest interval counted by digital delay 303. In the example presented here if the bit has a value of 1, it represents an additional delay of 5 nsec.

Counter 306 counts until the delay time has passed. Counter 306 produces an output pulse. The pulse is passed through AND gates 310 and 312. AND gates 310 and 312 receive at their second inputs the value stored in register 308. The input to AND gate 310 connected to register 308 has an inverted input. Thus, when the counter reaches its final value, only one of the AND gates 310 and 312 will produce an output.

The value loaded into counter 306 was the most significant bits of the digital value representing the required delay. Thus, when counter 306 has reached its final value, it signifies that the specified time for a pulse will occur at some time after the pulse, but that the specified time is less than the period of the clock used to clock counter 306. Here, counter 306 is clocked at 100 MHz. Thus, when counter 306 produces its output, it signifies that the specified time for the pulse is sometime within the next 10 nsec.

The next most significant bit of the required delay which was not loaded into counter 306 indicates in which half of that interval the specified time will occur. Specifically, when the next most significant bit is 0, the specified time is between 0 and 5 nsec after counter 306 produces its output. Conversely, when the next most significant bit is 1, the specified time is between 5 nsec and 10 nsec after counter 306 produces its output.

The next most significant bit is the bit which is stored in register 308. When that bit is 0, AND gate 310 produces an output when counter 306 produces its output. When that bit is 1, AND gate 312 produces an output. Thus, the output of AND gate 310 indicates that the specified time for a pulse in the edge signal is within 5 nsec. The output of AND gate 312 indicates that the specified time for a pulse in the edge signal will not occur for at least another 5 nsec.

In either events, the amount of time that must be counted after one of the AND gates 310 or 312 produces an output until the specified time for the edge pulse is given by the low order 9 bits out of adder 320. When the output of AND gate 310 goes high, those 9 bits represent a time which must be counted from the time output of AND gate 310 went high. When the output of AND gate 312 goes high, those 9 bits represent a time which must be counted starting 5 nsec after the output of AND gate 312 went high. As will be described below, those 9 bits are stored and used to introduce the required delay after the output of AND gate 310 or 312 goes high.

Each counter 306 is connected to its own set of AND gates 310 and 312. The outputs of all the AND gates 310 are OR-ed together at OR, gate 314. The outputs of all the AND gates 312 are OR-ed together at OR gate 316. The output of OR gate 314 is a signal MATCH0. The output of OR gate 316 is MATCH5. MATCH5 indicates that to produce the pulse at the required time, the timing generator must wait 5 nsec and then counts the delay indicated by the low order 9 bits of the specified delay. MATCH0 indicates that to produce a pulse at the required time, the timing generator counts the delay indicated by the low order 9 bits of the specified delay without waiting the 5 nsec.

The low order 9 bits of the specified delay out of adder 320 are passed to compensation circuit 321, which is explained in greater detail in conjunction with FIG. 5.

Those 9 bits make up a RES signal. That signal might optionally be passed to deskew delay circuit 318. Deskew memory 324 is programmed with deskew values which vary, depending on the drive format. Each channel will require a certain amount of deskew correction regardless of the drive format. Thus, deskew delay circuit 318 adds a fixed amount of delay while deskew memory adds the variable delay. Of course, all of the delay could be added by deskew memory 324, but a larger number of bits might be required. Deskew delay 318 also provides the same deskew delay to format data and the BOC signal generated by global timing circuitry 110 (FIG. 1).

The delayed 9 bits make up a RES' signal. RES' is passed to interpolator circuit 114, which is shown in FIG. 4. Preferably, interpolator circuit 114 is implemented as a full custom IC such as an ASIC.

Interpolator circuit 114 is clocked by a 100 MHz clock denoted as CLK__100. This may be the same clock as is used by timing logic 112. CLK__100 is provided to phase locked loop 410. Phase locked loop 410 generates clocks at 200 MHz and 800 MHz, which are denoted as CLK__200 and CLK__800, respectively. All three clocks are preferably synchronized.

CLK__100 clocks input registers 412 and 436 and also provides the write clock to FIFO 438. Thus, as RES' enters interpolator circuit 114, register 436 synchronizes it to CLK__100. Register 436 also registers the BOC' signal and FORMAT DATA'.

Timing information to specify an edge is generated by global timing circuit 110 (FIG. 1) once each tester cycle. Tester cycles could occur in the preferred embodiment at a maximum rate of 100 MHz. However, the tester can be programmed to generate tester cycles at a slower rate. Thus, for every cycle of CLK__100, there could be, but is not necessarily a new value of RES'. As global timing circuit 110 generates a BOC pulse for each cycle, it generates a BOC signal each time it generates new timing value. Thus, the BOC' signal indicates when RES' has taken on a new value.

BOC' is connected to the write enable input of FIFO 438. Thus, new data is clocked into FIFO 438 at a maximum rate of 100 MHz, but could enter at a slower rate. The data clocked into FIFO 438 is the RES' and the FORMAT DATA'.

FIFO 438, in the preferred embodiment has a depth of eight. The depth depends on the number of counters 306 (FIG. 3). If more counters are used, a greater depth is required.

As timing data for each cycle of the tester is generated, the least significant bits are segregated and stored in FIFO 438. The most significant bits of the timing data are stored in one of the counters 306 (FIG. 3). As described above, when a counter 306 reaches the end of its count, it signifies that a pulse should be generated. Reads from FIFO 438 are controlled to occur when the counters 306 indicate that the next pulse should be generated.

The read clock of FIFO 438 is connected to CLOCK__200, enabling pulses to be generated at a maximum rate of 200 MHz or, alternatively, with a spacing as small as 5 nsec. A read from FIFO 438 only occurs, though, when the counters 306 indicate that the next pulse should be generated. Thus, the read enable input of FIFO 438 is derived from the signals MATCH0 and MATCH5, which indicate the next pulse should be generated.

The signals MATCH0' and MATCH5' are latched by register 412. Register 412 serves to synchronize those signals to the 100 MHz clock used by interpolator circuitry 114.

The two signals are then synchronized to the appropriate edge of the 200 MHz Clock. MATCH0' is applied to one input of AND gate 432. The output of AND gate 432 is connected to register 434. Register 434 is clocked by the 200 MHz clock such that the output of register 434 is synchronized to the next pulse of the 200 MHz clock.

As the output of register 412 is controlled by a 100 MHz clock, every time the MATCH0' signal is asserted, the output of register 412 is asserted for two pulses of the 200 MHz clock. To prevent the output of register 434 from being asserted for two cycles of the 200 MHz clock, the output of register 434 is inverted and applied to the second input of AND gate 432. Thus, after the MATCH0' causes one output pulse at register 434, a second output pulse is prevented during the next cycle of the 200 MHz clock.

MATCH5' is also applied to an AND gate 414 and a register 416 configured like AND gate 432 and register 434. These elements serve to synchronize the MATCH5' signal to the 200 MHz clock in interpolator circuitry 114 and to allow only one pulse to be generated each time MATCH5' is asserted.

The MATCH0' signal indicates that the RES' value represents a delay relative to its occurrence. In contrast, the MATCH5' signal indicates that the RES' value represents a delay relative to a time 5 nsec after its occurrence. Thus, the MATCH5' should not cause timing information to be read from FIFO 438 until after a 5 nsec delay. A 5 nsec delay equals one pulse of CLK_200. To provide a delay of one pulse of CLK_200, the output of register 416 is fed to another register 418, which is also clocked by CLK_200.

A pulse at the output of either register 418 or 434 indicates that it is time to generate the next edge pulse. Those outputs are combined at OR gate 420 into one MATCH signal. The MATCH signal is applied to the read enable input of FIFO 438, causing it to output the timing adjustment for the next pulse, i.e. the next stored RES' value.

The RES' value for the next pulse is provided to register 440 while the MATCH signal is provided to register 422, Both registers are clocked by CLK_200, thus synchronizing the MATCH signal and the RES' value.

The output of register 422 is passed to register 424 and the output of register 440 is provided to register 442. Register 424 and 442 are clocked by CLK_800, thus synchronizing the timing information for one pulse to CLK_800.

The output of register 424 is provided as a signal input to course delay 426. The two most significant bits of the RES' signal are applied as a control input to course delay 426. Course delay 426 is a digital delay which delays the signal input by the number of clock pulses specified by the control input. This clock runs at 800 MHz, such that each pulse is 1.25 ns. The output of course delay 426 is the MATCH signal delayed by a course delay.

The output of course delay 426 is applied to fine delay circuit 428. Fine delay 428 is an analog interpolator which receives the seven least significant bits of the RES' signal as a control input. Fine delay 428 is shown in greater detail in conjunction with FIG. 5.

The output of fine delay circuit 428 is provided to one shot 430. The output of one shot 430 is the edge signal which is applied to the formatter 116 (FIG. 1). The required input or output operation is performed by formatter 116 in response to this edge signal.

FORMAT DATA' are also applied to register 436, FIFO 438, register 440 and register 442 in the same fashion as the RES' signal. These steps synchronize the FORMAT DATA' with the timing data represented by RES'. The FORMAT DATA' is then passed to register 444. Register 444 is clocked by the output of fine delay 428. Thus the FORMAT DATA' is clocked into register 444 as one shot 430 is producing the pulse to send to formatter 116. The pulse initiating the input/output event and the format and data for that event arrive at formatter 116 together. In this way, the correct input or output event occurs at the precise programmed time.

Turning now to FIG. 5, details of fine delay circuit 428 are shown. For simplicity adjustment circuit 321 is also shown, but without intervening stages which adjust delay.

Fine delay circuit 428 is an analog interpolator. It includes a comparator 512. One input of comparator 512 is connected to digital to analog converter (DAC) 514. The input to DAC 514 are the seven least significant bits of the residue signal after they have been corrected by correction circuit 321.

The second input of comparator 512 is connected to ramp generator 510. Ramp generator 510 is designed to generate an output voltage which in response to a pulse at the INPUT terminal, decreases linearly from some full scale voltage to a reference voltage. The reference voltage is the output of DAC 514 when it receives its maximum input. The full scale voltage is the output of DAC 514 when it receives its minimum input. In practice, it is often not possible to make the ramp linear over its full range so that the full scale and reference values represent the start and end of the linear portions of the ramp. To the extent that the full scale value occurs at some time after the pulse triggering the start of the ramp, this delay represents a delay associated with the channel which is compensated for using known deskew techniques.

In operation, DAC 514 will output some voltage in proportion to the magnitude of the residue signal. This voltage acts as a trigger voltage. Comparator 512 produces an output signal once the output of ramp generator exceeds the trigger voltage. The amount of time it takes for the ramp to exceed the trigger voltage is directly proportional to magnitude of the residue signal. Thus, the delay is proportional to the magnitude of the residue signal.

In the preferred embodiment, increasing the residue signal by one least significant bit should increase the delay by 9.76 psec (which is sometimes referred to simply as 10 psec). For this relationship to hold, the ramp must decrease from a value which equals the zero value of DAC 514 to the full scale out of DAC 514 in a time equal to $2^N*9.76$ psec, or 1.25 nsec. Here N is 7 because there are seven bits in the input to DAC 514.

FIG. 5 shows a preferred method of ensuring the appropriate relationship between the voltage ramp generator 510 and the output of DAC 514. In FIG. 5, ramp generator 510 is designed such that the ramp decreases by slightly less than the full scale Voltage of DAC 514 in 1.25 nsec. The ratio of the actual decrease in the ramp in 1.25 nsec to the full scale voltage of DAC 514 is computed. This ratio is stored in adjust register 326.

The value stored in adjust register 326 might be determined by connecting external instruments to the tester. Alternatively, that Value might be determined by self-contained measurements within the tester. The tester is designed to be programmed to determine whether the values of signals at any one of its channels have an expected value at a certain time. It is also programmed to generate certain values at certain times. To determine the value in adjust register 326, one channel is used as a receive channel and one channel is used as a drive channel. The two are connected together so that the signal in the drive channel passes to the receive channel.

The drive channel outputs a test pattern of values synchronized to one of its edges, which will be referred to as the drive edge. The receive channel compares the received values to the pattern at× synchronized to an edge, which will be referred to as the receive edge. Since the drive edge and receive edges are not necessarily coincident, sometimes the values in the receive channel will not match the expected values in the pattern. The tester interprets the failure to match, as a failure and the tester is designed to detect and count failures.

The timing of both the drive edge and the receive edge may be programmed as described above. The time of the drive edge is programmed to be 10 nsec. This delay is selected because it requires RESIDUE LSB (FIG. 5) input to DAC 514 to be zero. The timing of the receive edge is then adjusted until roughly half of the values in the pattern result in failures. This timing of the receive edge is then not changed during the determination of the adjustment value for the drive edge.

Then, the drive edge delay is set to 10 nsec minus 9.76 psec. This value is selected because it requires RESIDUE LSB (FIG. 5) input to DAC 514 to be full scale, but should otherwise result in virtually the same time delay as when a 10 nsec delay is programmed. With these timing settings, the test pattern is repeated. The value in adjust register 326 is changed until roughly half the input values result in failures.

Receive edges can be calibrated by the reverse procedure: first fixing the position of the drive edge and then adjusting the receive edge. In this way, adjustment values for edges can be determined one pair of edges at a time.

In operation, each set of residue values is multiplied by the value in adjust register 326. This multiplication effectively reduces the full scale value of DAC 514 so that the ramp decreases by the effective full scale value in 1.25 nsec to provide the desired relationships between the outputs of DAC 514 and ramp generator 510. The adjustment is made entirely by manipulating digital values. There is no need to make an adjustment to the analog circuitry in ramp generator 510 or to the analog circuitry which generates a reference voltage for DAC 514.

Having described one embodiment of the invention, numerous alternative embodiments might be constructed. First, it should be noted that the clock frequencies and numbers of bits in the various signals given above are intended for illustration. One of skill in the art could design a circuit with different frequency clocks or with signals having different numbers of bits.

Also, FIG. 3 shows that register 308 stores a one bit value. One bit is used to generate one of two match signals when the clock rate in interpolator circuitry 114 is twice as fast as the clock rate in timing logic 112. In the more general case, the ratio of the clock rate in interpolator circuit 114 to the clock rate of counters 306 may be expressed as $2^n$. Register 308 then must store n bits and $2^n$ match signals are generated. AND gates 310 and 312 are really acting as a one bit decoder which is enabled by the output of counter 306. In the more general case, an n bit decoder with an output enable would be used.

Also, delay circuit 303 is shown to be implemented with a plurality of down counters 306. The same effect could be achieved with up counters with one or more coincidence circuits connected to each counter. The count value would then be loaded into the coincidence circuit and it would produce an output pulse when the counter counted up to that value. Such an arrangement offers the advantage of allowing one counter to time multiple events, as long as all the events timed by the counter are referenced to the same starting point. For example, if there are multiple edges in a channel, all the edge signals for one period could be timed by the same counter.

Also, it is shown that FORMAT DATA' is stored in FIFO 438. Such an arrangement is optional. Format data might be passed directly to format circuit 116 as shown in FIG. 1. In that instance, care must be taken in the design of the tester to associate the format data with the edges out of interpolator 114.

Further, it was described that ramp generator 510 produces a ramp that decreases in value. While a decreasing ramp is customarily used in a timing interpolator, an increasing ramp could be mused as well.

Various features customarily found in digital circuits might be included. For example, during many tester cycles, many edges will not be active. Enable signals might be incorporated into the circuitry disclosed here so that it takes no action when an edge is inactive.

As another example, FIG. 4 shows that a FIFO is used to store timing values about successive edge pulses. This type of storing means requires that the timing values be read out in the order in which they are applied. This requirement implies that the user must program successive pulses in an edge signal in successive periods so that pulses specified in later periods always occur after pulses specified in earlier periods. However, if the residue information were stored in a memory structure which could be randomly accessed and each of the counters 306 were associated with one location, it would be possible to allow pulses in the edge signal to occur at arbitrary times without concern for the period in which they were specified.

Also, it is shown in FIG. 5 that adjustment register 326 and multiplier 322 are used to calibrate interpolator circuit 428. Conventional calibration techniques might also be used.

This invention might be used in conjunction with other techniques used to make a high speed timing generator. For example, pipelining could be used according to standard design techniques. It could also be used as part of a tester in which channels are interleaved to provide operation at a higher data rate.

Further, it was suggested that all channels have identical local timing generators. Such an arrangement is not necessary. It might be desirable to construct a tester having a some "fast" channels with timing generators according to the invention. Alternatively, all channels might use timing generators according to the invention, but the depth of the FIFOs and number of counters 306 in some channels could be increased. These channels could be used to generate long bursts of very high frequency signals.

It is also described that timing logic 112 is implemented as a CMOS gate array. CMOS is preferred because of its low cost, but other technologies could be used. For example, silicon bipolar, GaAs or BiCMOS technologies could be used.

It was also described that various increments of delay were added to timing signals in stages. The amount of delay added in each stage as well as the number of stages could be altered.

It is felt therefore that the invention should be limited only by the spirit and scope of the appended claims.

What is claimed is:

1. Automatic test equipment, comprising:
   a) means for generating a plurality of pulses, each indicating one cycle of operation of the automatic test equipment, and, for selected pulses, a digital value specifying a delay associated with that pulse;
   b) means, coupled to the means for generating pulses, for generating an output signal associated with each selected pulse after a first portion of the delay associated with that pulse has passed;
   c) means for storing a plurality of digital values associated with selected successive cycles, the signals representing a second portion of the delay associated with the pulse for that cycle; and
   d) means for retrieving the digital values from the storing means upon occurrence of the output signal and producing a delayed output signal after the second portion of the delay has passed.

2. The automatic test equipment of claim 1 wherein the means for storing comprises a FIFO memory.

3. The automatic test equipment of claim 2 wherein
a) the FIFO has a write control and a read control;
b) the write control of the FIFO is coupled to the means for generating a plurality of pulses; and
c) the read control of the FIFO is coupled to the means for generating an output signal.

4. The automatic test equipment of claim 3 wherein:
a) the delay associated with each selected pulse has a third portion distinct from the first and second portions;
b) the means for generating an output signal generates one of a plurality of output signals based on the value of the third portion of the delay; and
c) each of the plurality of output signals is delayed by an amount proportional to the value of the third portion of the delay before it is coupled to the read control of the FIFO.

5. The automatic test equipment of claim 1 wherein:
a) the means for generating a plurality of pulses generates pulses with a minimum time difference of a first value;
b) the means for retrieving retrieves successive digital values with a minimum time difference of a second value which is smaller than the first value.

6. The automatic test equipment of claim 5 wherein the second value is one half of the first value.

7. The automatic test equipment of claim 6 wherein the first value is 10 nanoseconds.

8. The automatic test equipment of claim 5 wherein the means for generating a plurality of pulses is a digital logic circuit implemented with CMOS technology.

9. The automatic test equipment of claim 8 wherein the means for storing and the means for retrieving are digital logic circuitry implemented with a technology having a maximum data rate in excess of 100 MHz.

10. The automatic test equipment of claim 9 wherein the means for storing and the means for retrieving are digital logic circuitry implemented with bipolar technology.

11. A method of operating automatic test equipment comprising the steps of:
a) generating time delay information for a plurality of cycles of tester operation;
b) splitting the delay information into at least three pieces, comprising a course delay, a fine delay and a timing adjustment delay, with the course delay representing an integer number of periods of a clock operating at a first frequency;
c) storing the fine delay information for each cycle for a period of time equal to the course delay;
d) retrieving the fine delay information synchronized with a clock operating at a second frequency which is higher than the first frequency, wherein the step of retrieving includes using the timing adjustment delay information to select the cycle of the second clock during which to retrieve the fine delay information; and
e) generating a timing signal based on the fine delay information.

12. The method of claim 11 wherein the step of storing includes storing fine delay information for one cycle while time delay information for an earlier cycle is already stored.

13. The method of claim 11 wherein the generated timing signal contains a burst of pulses having a frequency greater than the first clock frequency.

14. The method of claim 11 wherein the generated timing signal contains a burst of pulses having spacings which are smaller than the cycle of tester operation.

15. A tester having a plurality of channels which can generate a plurality of timing edge signals in each channel, comprising:

a) global timing circuitry having an output;
b) a plurality of channels, each having local timing circuitry, with the local timing circuitry in each channel having a plurality of edge timing circuits, each edge timing circuit comprising:
   i) a digital input for accepting a digital signal having a plurality of bits representing a timing delay;
   ii) a plurality of counters, each of the counters having inputs connected to the most significant bits of the digital input, and each of the counters having independent load enable inputs, and each of the counters having an independent output;
   iii) a plurality of registers, each associated with one of the counters and each having a load enable input coupled to the load enable input of its associated counter, said registers having an input coupled to selected bits of the digital input;
   iv) a plurality of decoder circuits, each associated with one of the counters and each having a data input coupled to the output of a register and an output enable input coupled to the output of its associated counter;
   v) a plurality of combinatorial logic circuits, each circuit having as inputs an output of each of the decoders, and each circuit having an output;
   vi) a second combinational logic circuit having a plurality of inputs and one output;
   vii) a plurality of signal paths between the outputs of the plurality of combinational logic circuits and the inputs of the second combinational logic circuit, each signal path having a different delay;
   viii) a FIFO having an input coupled to the least significant portion of the digital input and a write enable input coupled to the output of the global timing circuitry and a read enable input coupled to the output of the second combinational logic circuit, said FIFO also having an output; and
   ix) a programmable delay element having a signal input coupled to the output of the second combinational logic circuit and a control input coupled to the output of the FIFO, said programmable delay also having an output representing a timing edge signal.

16. The timing generator of claim 15 wherein the FIFO also includes a read clock and a write clock, the read clock having a frequency which is at least twice that of the write clock.

17. The timing generator of claim 16 wherein the write clock is in excess of 60 MHz.

18. The timing generator of claim 15 wherein the plurality of counters comprises at least 4.

19. The timing generator of claim 18 wherein the FIFO comprises a FIFO with a depth of at least 6.

20. The timing generator of claim 15 wherein the programmable delay element comprises a digital delay connected in series with an analog interpolator.

21. A programmable timing generator of the type which generates timing signals which are delayed relative to a reference time by an amount specified by a digital timing signal comprising:
a) an analog comparator having at least two inputs and an output;
b) a ramp generator having an output connected to a first input of the comparator;
c) a digital to analog converter having an output connected into a second input of the comparator and a digital input;
d) a digital multiplier having an output connected to the digital input of the digital to analog converter and at least two inputs, with a first input connected to at least a portion of the bits in a digital timing signal; and e) a register connected to the second input of the digital multiplier.

22. The method of operating automatic test equipment of the type having a programmable timing generator which produces a timing signal with a period controlled by an input digital word, comprising the steps of a) generating a signal with predetermined data values synchronized with a timing signal generated by the timing generator;

b) comparing the generated signal to a second signal having the predetermined data values synchronized with a a second timing signal;

c) computing a timing correction value based on the comparison; and d) multiplying at least a portion of the bits of subsequent input digital words by the timing correction values.

23. The method of operating the automatic test equipment of claim 22 wherein the portion of the bits consists of the low order bits of the input digital word.

24. The method of operating the automatic test equipment of claim 23 wherein the timing signal generated by the timing generator is generated in one channel of the tester and the second signal is generated within a second channel of the tester.

* * * * *